US009631127B2

(12) United States Patent
Keite-Telgenbüscher et al.

(10) Patent No.: US 9,631,127 B2
(45) Date of Patent: Apr. 25, 2017

(54) PRESSURE-SENSITIVE ADHESIVE MATERIAL PARTICULARLY FOR ENCASING AN ELECTRONIC ARRANGEMENT

(71) Applicant: tesa SE, Hamburg (DE)

(72) Inventors: Klaus Keite-Telgenbüscher, Hamburg (DE); Jan Ellinger, Hamburg (DE)

(73) Assignee: TESA SE, Norderstedt (DE)

( * ) Notice: Subject to any disclaimer, the term of this patent is extended or adjusted under 35 U.S.C. 154(b) by 159 days.

(21) Appl. No.: 14/422,203

(22) PCT Filed: Jul. 4, 2013

(86) PCT No.: PCT/EP2013/064145
§ 371 (c)(1),
(2) Date: Feb. 18, 2015

(87) PCT Pub. No.: WO2014/029545
PCT Pub. Date: Feb. 27, 2014

(65) Prior Publication Data
US 2015/0240134 A1    Aug. 27, 2015

(30) Foreign Application Priority Data

Aug. 24, 2012 (DE) .................. 10 2012 215 136
Oct. 30, 2012 (DE) .................. 10 2012 219 877

(51) Int. Cl.
| C08L 27/00 | (2006.01) |
| C09J 127/12 | (2006.01) |
| C09J 127/16 | (2006.01) |
| C08K 3/22 | (2006.01) |
| C08K 11/00 | (2006.01) |
| H05K 5/06 | (2006.01) |
| H01L 51/52 | (2006.01) |

(52) U.S. Cl.
CPC .............. *C09J 127/12* (2013.01); *C08K 3/22* (2013.01); *C08K 11/00* (2013.01); *C09J 127/16* (2013.01); *H05K 5/065* (2013.01); *C08K 2003/222* (2013.01); *H01L 51/5253* (2013.01); *H01L 2924/0002* (2013.01)

(58) Field of Classification Search
CPC ......... C09J 127/12; C09J 127/16; C08K 3/22; C08K 11/00; C08K 2003/222; H01L 51/5253; H01L 2924/0002
See application file for complete search history.

(56) References Cited

U.S. PATENT DOCUMENTS

| 4,051,195 A | 9/1977 | McWhorter |
| 4,158,678 A | 6/1979 | Tatemoto et al. |
| 4,361,678 A | 11/1982 | Tatemoto et al. |
| 4,387,168 A | 6/1983 | Morita |
| 4,491,536 A | 1/1985 | Tomoda et al. |
| 4,552,604 A | 11/1985 | Green |
| 4,603,175 A * | 7/1986 | Kawachi et al. ....... C08L 27/12 522/113 |
| 4,647,157 A | 3/1987 | Chiklis |
| 5,143,761 A | 9/1992 | Chiotis et al. |
| 2004/0048983 A1 | 3/2004 | Hochgesang et al. |
| 2004/0162380 A1 | 8/2004 | Kojima et al. |
| 2004/0225025 A1 | 11/2004 | Sullivan et al. |
| 2005/0228096 A1 | 10/2005 | Kirsten et al. |
| 2007/0135552 A1 | 6/2007 | Wrosch et al. |
| 2009/0084602 A1 | 4/2009 | Fukuda et al. |
| 2010/0264376 A1 | 10/2010 | Korzhenko et al. |
| 2011/0121356 A1 | 5/2011 | Krawinkel et al. |
| 2013/0194735 A1* | 8/2013 | Kajiya et al. .......... H05K 5/061 361/679.01 |

FOREIGN PATENT DOCUMENTS

| CN | 1513907 A | 7/2004 |
| DE | 31 38 300 A1 | 6/1982 |
| DE | 690 19 061 T2 | 10/1995 |
| DE | 689 24 656 T2 | 8/1996 |
| DE | 10 2008 060 113 A1 | 7/2010 |
| EP | 0 132 834 A2 | 2/1985 |
| EP | 0 399 543 A2 | 11/1990 |
| EP | 1 400 563 A1 | 3/2004 |
| EP | 1 518 912 A1 | 3/2005 |
| EP | 2 043 147 A2 | 4/2009 |
| JP | S53 003 495 A | 1/1978 |
| JP | S53 086 786 B2 | 7/1978 |
| JP | S56 057 811 A1 | 5/1981 |
| JP | EP 0399543 A2 * | 11/1990 ............ C09J 127/12 |
| WO | 98/21287 A1 | 5/1998 |

(Continued)

OTHER PUBLICATIONS

English Translation of Chinese Office Action dated Dec. 3, 2015.
English Translation of Chinese Second Office Action for corresponding Chinese Patent Application No. 201380052807.3 issued Aug. 5, 2016.
International Search Report dated Oct. 7, 2013, mailed Oct. 31, 2013.
English Translation of International Search Report dated Oct. 7, 2013, mailed Oct. 31, 2013.
German Search Report dated Mar. 26, 2013.

(Continued)

*Primary Examiner* — Nathan M Nutter

(74) *Attorney, Agent, or Firm* — Norris McLaughlin & Marcus P.A.

(57) ABSTRACT

Pressure-sensitive adhesive material for encasing an electronic arrangement to prevent permeate, which material comprises at least 70 percent by weight of a mixture of at least one fluorine-containing thermoplastic elastomer and at least one fluorine-containing liquid elastomer, wherein the mass ratio of the fluorine-containing liquid elastomer to the fluorine-containing thermoplastic elastomer is between 5:95 to 55:45.

17 Claims, 2 Drawing Sheets

(56) References Cited

FOREIGN PATENT DOCUMENTS

WO          02/26908 A1     4/2002
WO     2010/109118 A1     9/2010

OTHER PUBLICATIONS

Notification for the Opinion of Examination corresponding to Taiwanese application No. 102128657, issued by the Taiwanese Patent Office on Dec. 20, 2016.

Official Action corresponding to European application No. 13735003.9, issued by the European Patent Office on Sep. 19, 2016.

\* cited by examiner

PRESSURE-SENSITIVE ADHESIVE MATERIAL PARTICULARLY FOR ENCASING AN ELECTRONIC ARRANGEMENT

This is a 371 of PCT/EP2013/064145 filed 4 Jul. 2013, which claims foreign priority benefit under 35 U.S.C. 119 of German Patent Applications 10 2012 215 136.2 filed 24 Aug. 2012 and 10 2012 219 877.6, filed 30 Oct. 2012, the entire contents of which are incorporated herein by reference.

BACKGROUND OF THE INVENTION

The present invention relates to a pressure-sensitive adhesive particularly for encapsulating an electronic arrangement.

(Opto)electronic arrangements are being used with ever-increasing frequency in commercial products or are close to market introduction. Such arrangements comprise organic or inorganic electronic structures, examples being organic, organometallic or polymeric semiconductors or else combinations of these. Depending on the desired application, these arrangements and products are rigid or flexible in form, there being an increasing demand for flexible arrangements. Arrangements of this kind are produced, for example, by printing techniques, such as relief, gravure, screen or planographic printing, or else what is called "non-impact printing", such as, for instance, thermal transfer printing, inkjet printing or digital printing. In many cases, however, vacuum techniques are used as well, such as chemical vapor deposition (CVD), physical vapor deposition (PVD), plasma-enhanced chemical or physical deposition techniques (PECVD), sputtering, (plasma) etching or vapor coating, with patterning taking place generally through masks.

Examples of (opto)electronic applications that are already commercial or are of interest in terms of their market potential include electrophoretic or electrochromic constructions or displays, organic or polymeric light-emitting diodes (OLEDs or PLEDs) in readout and display devices or as illumination, electroluminescent lamps, light-emitting electrochemical cells (LEECs), organic solar cells, preferably dye or polymer solar cells, inorganic solar cells, preferably thin-film solar cells, more particularly those based on silicon, germanium, copper, indium and/or selenium, organic field-effect transistors, organic switching elements, organic optical amplifiers, organic laser diodes, organic or inorganic sensors or else organic- or inorganic-based RFID transponders.

A perceived technical challenge for realization of sufficient lifetime and function of (opto)electronic arrangements in the area of organic and/or inorganic (opto)electronics, especially in the area of organic (opto)electronics, is the protection of the components they contain against permeants. Permeants may be a large number of low molecular mass organic or inorganic compounds, more particularly water vapor and oxygen.

A large number of (opto)electronic arrangements in the area of organic and/or inorganic (opto)electronics, especially where organic raw materials are used, are sensitive not only to water vapor but also to oxygen, and for many arrangements the penetration of water vapor is classed as a relatively severe problem. During the lifetime of the electronic arrangement, therefore, it requires protection by means of encapsulation, since otherwise the performance drops off over the period of application. For example, oxidation of the components, in the case of light-emitting arrangements such as electroluminescent lamps (EL lamps) or organic light-emitting diodes (OLEDs) for instance, may drastically reduce the luminosity, the contrast in the case of electrophoretic displays (EP displays), or the efficiency in the case of solar cells, within a very short time.

In organic and/or inorganic (opto)electronics, particularly in the case of organic (opto)electronics, there is a particular need for flexible bonding solutions which constitute a permeation barrier to permeants, such as oxygen and/or water vapor. In addition there are a host of further requirements for such (opto)electronic arrangements. The flexible bonding solutions are therefore intended not only to achieve effective adhesion between two substrates, but also, in addition, to fulfill properties such as high shear strength and peel strength, chemical stability, aging resistance, high transparency, ease of processing, and also high flexibility and pliability.

Specific requirements exist in respect of dye solar cells in which the region between the two electrodes is filled with a redox electrolyte, as for example a solution of iodine ($I_2$) and potassium iodide. Constituents of the electrolyte generally include ionic liquids and/or solvents (for example, valeronitrile, 3-methoxyvaleronitrile). A major barrier to the dye solar cell technology on its path from the laboratory scale to extensive applications is the long-term-stable sealing of the electrolyte. In addition to the properties identified above, therefore, the flexible bonding solution must also be highly resistant to the electrolyte.

One approach common in the prior art, therefore, is to place the electronic arrangement between two substrates that are impermeable to water vapor and oxygen. This is then followed by sealing at the edges. For non-flexible constructions, glass or metal substrates are used, which offer a high permeation barrier but are very susceptible to mechanical loads. Furthermore, these substrates give rise to a relatively high thickness of the arrangement as a whole. In the case of metal substrates, moreover, there is no transparency. For flexible arrangements, in contrast, sheetlike substrates are used, such as transparent or non-transparent films, which may have a multi-ply configuration. In this case it is possible to use not only combinations of different polymers, but also organic or inorganic layers. The use of such sheetlike substrates allows a flexible, extremely thin construction. For the different applications there are a very wide variety of possible substrates, such as films, wovens, nonwovens and papers or combinations thereof, for example.

In order to obtain the most effective sealing, specific barrier adhesives are used. A good adhesive for the sealing of (opto)electronic components has a low permeability for oxygen and particularly for water vapor, has sufficient adhesion to the arrangement, and is able to flow well onto the arrangement. Owing to incomplete wetting of the surface of the arrangement and to pores that remain, a low capacity for flow on the arrangement may reduce the barrier effect at the interface, since it permits lateral ingress of oxygen and water vapor independently of the properties of the adhesive. Only if the contact between adhesive and substrate is continuous are the properties of the adhesive the determining factor for the barrier effect of the adhesive.

For the purpose of characterizing the barrier effect it is usual to state the oxygen transmission rate OTR and the water vapor transmission rate WVTR. Each of these rates indicates the flow of oxygen or water vapor, respectively, through a film per unit area and unit time, under specific conditions of temperature and partial pressure and also, optionally, further measurement conditions such as relative atmospheric humidity. The lower the OTR or WVTR values the more suitable the respective material for encapsulation. The statement of the permeation is not based solely on the values of WVTR or OTR, but instead also always includes an indication of the average path length of the permeation, such as the thickness of the material, for example, or a standardization to a particular path length.

The permeability P is a measure of the perviousness of a body for gases and/or liquids. A low P value denotes a good barrier effect. The permeability P is a specific value for a defined material and a defined permeant under steady-state conditions and with defined permeation path length, partial pressure and temperature. The permeability P is the product of diffusion term D and solubility term S: P=D*S The solubility term S describes in the present case the affinity of the barrier adhesive for the permeant. In the case of water vapor, for example, a low value for S is achieved by hydrophobic materials. The diffusion term D is a measure of the mobility of the permeant in the barrier material, and is directly dependent on properties such as the molecular mobility or the free volume. Often, in the case of highly crosslinked or highly crystalline materials, relatively low values are obtained for D. Highly crystalline materials, however, are generally less transparent, and greater crosslinking results in a lower flexibility. The permeability P typically rises with an increase in the molecular mobility, as for instance when the temperature is raised or the glass transition point is exceeded.

A low solubility term S is usually insufficient for achieving good barrier properties. One classic example of this, in particular, are siloxane elastomers. The materials are extraordinarily hydrophobic (low solubility term), but as a result of their freely rotatable Si—O bond (large diffusion term) have a comparatively low barrier effect for water vapor and oxygen. For a good barrier effect, then, a good balance between solubility term S and diffusion term D is necessary.

Approaches for increasing the barrier effect of an adhesive must take account of the two parameters D and S, with a view in particular to their influence on the permeability of water vapor and oxygen. In addition to these chemical properties, thought must also be given to consequences of physical effects on the permeability, particularly the average permeation path length and interface properties (flow-on behavior of the adhesive, adhesion). The ideal barrier adhesive has low D values and S values in conjunction with very good adhesion to the substrate.

For this purpose use has hitherto been made in particular of liquid adhesives and adhesives based on epoxides (WO 98/21287 A1; U.S. Pat. No. 4,051,195 A; U.S. Pat. No. 4,552,604 A). As a result of a high degree of crosslinking, these adhesives have a low diffusion term D. Their principal field of use is in the edge bonding of rigid arrangements, but also moderately flexible arrangements. Curing takes place thermally or by means of UV radiation. Full-area bonding is hard to achieve, owing to the contraction that occurs as a result of curing, since in the course of curing there are stresses between adhesive and substrate that may in turn lead to delamination.

Using these liquid adhesives harbors a series of disadvantages. For instance, low molecular mass constituents (VOCs—volatile organic compounds) may damage the sensitive electronic structures in the arrangement and may hinder production operations. The adhesive must be applied, laboriously, to each individual constituent of the arrangement. The acquisition of expensive dispensers and fixing devices is necessary in order to ensure precise positioning. Moreover, the nature of application prevents a rapid continuous operation, and the laminating step that is subsequently needed may also make it more difficult, owing to the low viscosity, to achieve a defined layer thickness and bond width within narrow limits.

Furthermore, the residual flexibility of such highly crosslinked adhesives after curing is low. In the low temperature range or in the case of 2-component systems, the use of thermally crosslinking systems is limited by the potlife, in other words the working time until gelling has taken place. In the high temperature range, and particularly in the case of long reaction times, in turn, the sensitive (opto)electronic structures limit the possibility of using such systems. The maximum temperatures that can be employed in the case of (opto)electronic structures are often 60° C., since above even this temperature there may be initial damage. Flexible arrangements which comprise organic electronics and are encapsulated using transparent polymer films or assemblies of polymer films and inorganic layers, in particular, have narrow limits here. The same applies to laminating steps under high pressure. In order to achieve improved durability, it is advantageous here to forgo a temperature loading step and to carry out lamination under a relatively low pressure.

As an alternative to the thermally curable liquid adhesives, radiation-curing adhesives as well are now used in many cases (US 2004/0225025 A1). The use of radiation-curing adhesives prevents long-lasting thermal load on the electronic arrangement.

Particularly if the (opto)electronic arrangements are to be flexible, it is important that the adhesive used is not too rigid and brittle. Accordingly, pressure-sensitive adhesives (PSAs) and heat-activatedly bondable adhesive sheets are particularly suitable for such bonding. In order to flow well onto the substrate but at the same time to attain a high bonding strength, the adhesives ought initially to be very soft, but then to be able to be crosslinked. As crosslinking mechanisms it is possible, depending on the chemical basis of the adhesive, to implement thermal cures and/or radiation cures. While thermal curing is very slow, radiation cures can be initiated within a few seconds. Accordingly, radiation cures, more particularly UV curing, are preferred, especially in the case of continuous production processes.

DE 10 2008 060 113 A1 describes a method for encapsulating an electronic arrangement with respect to permeants, using a PSA based on butylene block copolymers, more particularly isobutylene block copolymers, and describes the use of such an adhesive in an encapsulation method. In combination with the elastomers, defined resins, characterized by DACP and MMAP values, are preferred. The adhesive, moreover, is preferably transparent and may exhibit UV-blocking properties. As barrier properties, the adhesive preferably has a WVTR of <40 $g/m^2*d$ and an OTR of <5000 $g/m^2*d$ bar. In the method, the PSA may be heated during and/or after application. The PSA may be crosslinked—by radiation, for example. Classes of substance are proposed via which such crosslinking can be advantageously performed. However, no specific examples are given that lead to particularly low volume permeation and interfacial permeation in conjunction with high transparency and flexibility.

EP 1 518 912 A1 teaches an adhesive for encapsulating an electroluminescent element which comprises a photocationically curable compound and a photocationic initiator. Curing takes place as a dark reaction following light stimulation. The adhesive is preferably epoxy-based. Aliphatic hydroxides and polyethers may be added as co-crosslinking components. Moreover, a tackifier resin may be present in order to adjust adhesion and cohesion. This may also include polyisobutylene. No specific information is given regarding the compatibility of the individual constituents, and there are also no indications given of molar masses of the polymers.

It is an object of the invention to provide a pressure-sensitive adhesive which is able to prevent the harmful influence of oxygen and water vapor on sensitive functional layers such as, for example, in the area of organic photoelectric cells for solar modules, or in the area of organic light-emitting diodes (OLEDs), by means of a good barrier effect with respect to the harmful substances; which has long-term resistance toward external influences such as weathering or UV light; which is inert toward the (opto) electronic construction; which is able to join different components of the functional elements to one another; which is readily manageable in adhesive bonding operations; which allows flexible and tidy working; and which is nevertheless easy to use for the producer. A particular object of the invention is to provide a PSA for the encapsulation of dye solar cells that is inert toward the electrolytes used in these cells.

SUMMARY OF THE INVENTION

The invention accordingly provides a pressure-sensitive adhesive for encapsulating an electronic arrangement with respect to permeants, comprising to an extent of at least 70 wt %, preferably at least 90 wt % (based in each case on the overall composition of the pressure-sensitive adhesive), a mixture of at least one fluorine-containing thermoplastic elastomer and at least one fluorine-containing liquid elastomer, the mass ratio of the fluorine-containing liquid elastomer to the fluorine-containing thermoplastic elastomer being between 5:95 to 55:45, preferably between 15:75 and 50:50, and more preferably between 25:75 and 40:60.

The adhesive of the invention is configured as a pressure-sensitive adhesive (PSA). Hereinafter, therefore, the terms "adhesive" and "pressure-sensitive adhesive" or "PSA" are generally used synonymously.

DETAILED DESCRIPTION

PSAs are adhesives which permit a durable join to the substrate even under relatively weak applied pressure and which after use can be detached from the substrate again substantially without residue. At room temperature, PSAs have a permanently pressure-sensitively adhesive effect, hence having a sufficiently low viscosity and a high initial tack, allowing them to wet the surface of the respective substrate even under low applied pressure. The bondability of the adhesives derives from their adhesive properties, and the redetachability from their cohesive properties.

Included in particular under this heading are compositions possessing adhesive properties in accordance with the "Handbook of Pressure Sensitive Adhesive Technology" by Donatas Satas (Satas & Associates, Warwick 1999), especially those which meet the Dahlquist criterion.

The fluorine-containing thermoplastic elastomer or elastomers are preferably selected from the group consisting of a fluorine-containing elastomer having at least one soft segment, consisting of a terpolymer of vinylidene fluoride/hexafluoropropylene/tetrafluoroethylene or vinylidene fluoride/chlorotrifluoroethylene/tetrafluoroethylene, and at least one hard segment, consisting of a copolymer of tetrafluoroethylene/ethylene or chlorotrifluoroethylene/ethylene or polyvinylidene fluoride, a fluorine-containing elastomer having at least one soft segment composed of a copolymer of tetrafluoroethylene/propylene and at least one hard segment composed of a copolymer of tetrafluoroethylene/ethylene, and/or a fluorine-containing elastomer having at least one soft segment composed of an amorphous rubberlike copolymer of tetrafluoroethylene/perfluoroalkyl vinyl ether and at least one hard segment composed of a copolymer of tetrafluoroethylene/perfluoroalkyl vinyl ether in which the amount of perfluoroalkyl vinyl ether is less than in the soft segment.

Specific examples of the fluorine-containing thermoplastic elastomer are an elastomer which comprises at least one soft segment composed of a terpolymer of vinylidene fluoride/hexafluoropropylene/tetrafluoroethylene or vinylidene fluoride/chlorotrifluoroethylene/tetrafluoroethylene and at least one hard segment composed of a copolymer of tetrafluoroethylene/ethylene or chlorotrifluoroethylene/ethylene or polyvinylidene fluoride, an elastomer which comprises at least one soft segment composed of a copolymer of tetrafluoroethylene/propylene and at least one hard segment composed of a copolymer of tetrafluoroethylene/ethylene, and/or an elastomer which comprises at least one soft segment composed of an amorphous rubberlike copolymer of tetrafluoroethylene/perfluoroalkyl vinyl ether and at least one hard segment composed of a copolymer of tetrafluoroethylene/perfluoroalkyl vinyl ether in which the amount of perfluoroalkyl vinyl ether is less than in the soft segment.

These fluorine-containing thermoplastic elastomers are disclosed in JP 53 086 786 A and in U.S. Pat. No. 4,158,678 A.

The fluorine-containing thermoplastic elastomer is preferably prepared by processes which are described in JP 53 003 495 A and in U.S. Pat. No. 4,158,678 A.

The fluorine-containing thermoplastic elastomer has the advantage of being transparent. The transparency or the degree of transmission—occasionally referred to just as transmittance for short—is specified generally in % and is the ratio of the luminous power arriving at the reverse face of a body through which light is irradiated, to the luminous power incident on the front face. Transmission is curtailed by reflection and absorption. The equation is therefore as follows: transmittance=(1−reflectance−absorptance). The thermoplastic elastomers preferably have a transmittance of more than 75%, more particularly a transmittance of more than 90%, in each case at a wavelength of 350 to 1150 nm.

In one preferred embodiment of the present invention, the fluorine-containing thermoplastic elastomer and the fluorine-containing liquid elastomer are combined in such a way that the thermoplastic fluorine-containing elastomer is compatible with the fluorine-containing liquid elastomer, the former therefore being dissolved or swelling freely in the latter. The monomer composition of the soft segment of the thermoplastic elastomer or the monomer composition of the fluorine-containing copolymer or terpolymer is selected to be similar to the monomer composition of the liquid elastomer, in order to prevent phase separation of all preferred mass ratios of the components. Otherwise there is migration of the liquid component and an alteration of the properties of the PSA.

One preferred combination of the elastomers is a combination of a fluorine-containing liquid elastomer composed of vinylidene fluoride, hexafluoropropylene, and tetrafluoroethylene and of a fluorine-containing thermoplastic elastomer which comprises a soft segment composed of the same terpolymer as the liquid elastomer. Another preferred combination of the elastomers is a combination of a fluorine-containing liquid elastomer which is a tetrafluoroethylene/propylene copolymer or a tetrafluoroethylene/perfluoropropyl vinyl ether copolymer and of a fluorine-containing thermoplastic elastomer having a soft segment composed of the same copolymer as the liquid elastomer.

Examples of the hard segment of the fluorine-containing thermoplastic elastomer are a crystalline copolymer segment which comprises tetrafluoroethylene and ethylene, a polyvinylidene fluoride segment, a crystalline copolymer segment composed of tetrafluoroethylene and perfluoropropyl vinyl ether.

The composition according to the invention may be produced by mixing the fluorine-containing thermoplastic elastomer and the fluorine-containing liquid elastomer using a rubber roll, a calender roll, or a kneading apparatus, at a temperature from room temperature to about 200° C., to give a homogeneous compound. If necessary a solvent that is compatible with the composition can be used. The elastomer composition may be used in the form of a solution, in order to facilitate its working, although it can be worked at a high temperature even without solvent. Alternatively, the adhesive composition of the present invention can be produced by mixing aqueous dispersions of the elastomers and removing water.

The fluorine-containing (thermoplastic) elastomer and the liquid fluorine-containing elastomer are preferably dissolved in a suitable solvent. Examples of such solvents could include lower ketones and esters.

The fluorine-containing liquid elastomer used in the present invention may be produced by a method for lowering the molecular weight of the elastomer, this method being disclosed in JP 56 057 811 A and in U.S. Pat. No. 4,361,678 A.

The fluorine-containing elastomer preferably has stabilized molecular ends and enters into hardly any chemical reactions, thereby preventing aging of the adhesive property. Preferred examples of fluorine-containing liquid elastomers are elastomers based on vinylidene fluoride/hexafluoropropylene, on vinylidene fluoride/hexafluoropropylene/tetrafluoroethylene, on tetrafluoroethylene/propylene, on hexafluoropropylene/ethylene, fluorosilicone elastomers, and fluorine-substituted phosphazene elastomers. The liquid elastomer has a number-average molecular weight $M_z$ of 500 to 20 000, preferably 500 to 10 000. They may be used independently or as a mixture.

In order to improve the bond strength or properties of the adhesive composition, a functional group such as —OH or —COOH may be introduced into the polymer chains or onto the ends of the polymer chains. Such a group may be introduced into the polymer chains by randomly copolymerizing a compound of the following formula: $CF_2=CFCH_2CH_2OH$ or $CF_2=CFCF_2COOH$.

In order to improve the adhesion of the PSA and hence the thermal shear strength, the PSA can be crosslinked. This can be done via aminic crosslinking, crosslinking with a bisphenol (such as bisphenol AF, for example), or via peroxides. Crosslinking operations of these kinds are known to the skilled person and are used in particular for the production of highly crosslinked fluorinated rubbers. Details concerning the crosslinking of fluoropolymers may be found in, for example "Fluoroelastomer Handbook: The Definite Users Guide and Databook, Alber L. Moore, 2005 William Andrew Publishing/Plastics Design Library".

For the use according to the invention, preference is given to employing aminic crosslinking—in that case, in particular, at least difunctional primary and/or secondary amines are used. Examples of primary and/or secondary amines here include the Epikure series from Momentive (for instance Epikure 925, triethylene tetramine, 3,6-diazaoctane-1,8-diamine), Jeffamines from Huntsman (for instance Jeffamine SD 2001, secondary polyetheramine), or Baxxodur from BASF. Preference is given to using aliphatic amines, in order to achieve good aging stability.

In combination with the stated primary and/or secondary amines, preference is given to using strong organic bases (preferably tertiary amines, such as amidines or guanidines) such as, for example, DBU (1,8-diazabicyclo[5.4.0]undec-7-ene), TBD (1,5,7-triazabicyclo[4.4.0]dec-5-ene), DBN (1,5-diazabicyclo[4.3.0]non-5-ene), or others, as available for instance in the Jeffcat series from Huntsman, since doing so permits an accelerated crosslinking reaction at temperatures which are low by comparison with conventional processes.

Preferably not more than up to 1.0 wt % of the strong base is used, based on the fluoroelastomer component, in order to achieve a sufficiently long potlife. Preference is given to using 0.005 to 0.5 wt %, and particular preference to using 0.01 to 0.2 wt %. In order to achieve sufficient crosslinking density and hence cohesion of the PSA, between 0.1 wt % and 10 wt % of the primary and/or secondary amine is used, preferably 0.25 wt % to 5 wt %, and more preferably 0.5 wt % to 3 wt %.

Used optionally in addition is an acid scavenger, such as a nanoscale metal oxide such as MgO or CaO, for example, in order to scavenge HF that is formed. Nanoscale metal oxides permit transparent PSAs, and relatively small amounts can be used by virtue of the high surface area.

Standard crosslinkings only with—for example—hexamethylenediamine in the case of amine crosslinking, or crosslinkings involving a bisphenol (for example, bisphenol A or bisphenol AF) with inorganic bases, such as calcium hydroxide, require crosslinking temperatures of more than 170° C. for 15 to 30 minutes. Crosslinking via peroxides and crosslinkers such as TAlC (triallyl isocyanurate) is likewise possible, but cure-side monomers incorporated in the polymer chain are vital. If they are absent, complete crosslinking is not possible. Another crosslinking possibility is that of electron beam curing.

Fillers can be used advantageously in the PSAs of the invention. As fillers in the adhesive it is preferred to use nanoscale and/or transparent fillers. In the present context a filler is termed nanoscale if in at least one dimension it has a maximum extent of about 100 nm, preferably about 10 nm. Particular preference is given to using those fillers which are transparent in the adhesive and have a platelet-shaped crystallite structure and a high aspect ratio with homogeneous distribution. The fillers with a platelet-like crystallite structure and with aspect ratios of well above 100 generally have a thickness of only a few nm, but the length and/or width of the crystallites may be up to several μm. Fillers of this kind are likewise referred to as nanoparticles. The particulate architecture of the fillers with small dimensions, moreover, is particularly advantageous for a transparent embodiment of the PSA. Examples that might be given here include nanoscale fillers based on $SiO_2$, $BaSO_4$ or MgO.

Through the construction of labyrinthine structures by means of the fillers described above in the adhesive matrix, the diffusion pathway for, for example, oxygen and water vapor is extended in such a way that their permeation through the layer of adhesive is lessened. For improved dispersibility of these fillers in the binder matrix, these fillers may be surface-modified with organic compounds. The use of such fillers per se is known from US 2007/0135552 A1 and from WO 02/026908 A1, for example.

In another advantageous embodiment of the present invention, use is also made of fillers which are able to interact in a particular way with oxygen and/or water vapor. Water vapor or oxygen penetrating into the (opto)electronic arrangement is then chemically or physically bound to these fillers. These fillers are also referred to as getters, scavengers, desiccants or absorbers. Such fillers include by way of example, but without restriction, the following: oxidizable metals, halides, salts, silicates, oxides, hydroxides, sulfates, sulfites, carbonates of metals and transition metals, perchlorates and activated carbon, including its modifications. Examples are cobalt chloride, calcium chloride, calcium bromide, lithium chloride, zinc chloride, zinc bromide, silicon dioxide (silica gel), aluminum oxide (activated aluminum), calcium sulfate, copper sulfate, sodium dithionite, sodium carbonate, magnesium carbonate, titanium dioxide, bentonite, montmorillonite, diatomaceous earth, zeolites and oxides of alkali metals and alkaline earth metals, such as barium oxide, calcium oxide, iron oxide and magnesium oxide, or else carbon nanotubes. Additionally it is also possible to use organic absorbers, examples being polyolefin copolymers, polyamide copolymers, PET copolyesters or other absorbers based on hybrid polymers, which are used generally in combination with catalysts such as cobalt, for example. Further organic absorbers are, for instance, polyacrylic acid with a low degree of crosslinking, ascorbates, glucose, gallic acid or unsaturated fats and oils.

In order to maximize the activity of the fillers in terms of the barrier effect, their fraction should not be too small. The fraction is preferably at least 3 wt %, more preferably at least 7 wt % and very preferably at least 10 wt %. Typically as high as possible a fraction of fillers is employed, without excessively lowering the bond strengths of the adhesive or adversely affecting other properties. The mixture according to the invention may include a filler, specifically at up to 30 wt % (based on the overall composition of the adhesive). The fraction of the fillers preferably does not exceed 20 wt %, more preferably not 15 wt % (based on the overall composition of the adhesive).

Also advantageous is a very fine division and very high surface area on the part of the fillers. This allows a greater efficiency and a higher loading capacity, and is achieved in particular using nanoscale fillers.

The fillers are not mandatory; the adhesive also operates without the addition thereof individually or in any desired combination.

According to a further advantageous embodiment, the adhesive of the invention comprises at least one kind of a preferably at least partly hydrogenated tackifier resin, advantageously of the sort which are compatible with the copolymer or, where a copolymer constructed from hard blocks and soft blocks is used, are compatible primarily with the soft block (soft resins).

It is advantageous if this tackifier resin has a tackifier resin softening temperature of greater than 25° C. It is advantageous, furthermore, if additionally at least one kind of tackifier resin having a tackifier resin softening temperature of less than 20° C. is used. In this way it is possible, if necessary, to fine-tune not only the technical bonding behavior but also the flow behavior on the bonding substrate.

Resins in the PSA may be, for example, unhydrogenated, partially hydrogenated or fully hydrogenated resins based on rosin and rosin derivatives, especially glycerol esters of fully hydrogenated rosin, hydrogenated polymers of dicyclopentadiene, partially, selectively or fully hydrogenated hydrocarbon resins based on $C_5$, $C_5/C_9$ or $C_9$ monomer streams, polyterpene resins based on α-pinene and/or β-pinene and/or δ-limonene, and hydrogenated polymers of preferably pure $C_8$ and $C_9$ aromatics. Aforementioned tackifier resins may be used either alone or in a mixture.

It is possible here to use both room-temperature-solid resins and liquid resins. In order to ensure high aging stability and UV stability, hydrogenated resins with a degree of hydrogenation of at least 90%, preferably of at least 95%, are preferred.

Preference is given, furthermore, to apolar resins having a DACP (diacetone alcohol cloud point) of more than 30° C. and an MMAP (mixed methylcyclohexane aniline point) of greater than 50° C., more particularly having a DACP of more than 37° C. and an MMAP of greater than 60° C. The DACP and the MMAP each indicate the solubility in a particular solvent. Through the selection of these ranges, the resulting permeation barrier, especially with respect to water vapor, is particularly high.

Surprisingly compatible are polar resins having a DACP of less than 20° C. and an MMAP of less than 0° C. With such resins, the bond strength can be increased significantly.

The adhesive may have customary adjuvants added, such as aging inhibitors (antiozonants, antioxidants, light stabilizers, etc.).

Additives for the adhesive that are typically utilized are as follows:
  plasticizers such as, for example, plasticizer oils or low molecular mass liquid polymers such as, for example, low molecular mass polybutenes
  primary antioxidants such as, for example, sterically hindered phenols
  secondary antioxidants such as, for example, phosphites or thioethers
  process stabilizers such as, for example, C radical scavengers
  light stabilizers such as, for example, UV absorbers or sterically hindered amines
  processing assistants
  wetting additives
  adhesion promoters
  endblock reinforcer resins and/or
  optionally further polymers, preferably elastomeric in nature; elastomers which can be utilized accordingly include, among others, those based on pure hydrocarbons, examples being unsaturated polydienes such as natural or synthetically produced polyisoprene or polybutadiene, elastomers with substantial chemical saturation, such as, for example, saturated ethylene-propylene copolymers, α-olefin copolymers, polyisobutylene, butyl rubber, ethylene-propylene rubber, and also chemically functionalized hydrocarbons such as, for example, halogen-containing, acrylate-containing, allyl ether-containing or vinyl ether-containing polyolefins.

The adjuvants are likewise not mandatory; the adhesive also works without their addition, individually or in any desired combination.

With further preference an adhesive is employed which in certain embodiments is transparent in the visible light of the spectrum (wavelength range from about 400 nm to 800 nm). The desired transparency can be achieved in particular through the use of colorless tackifier resins. A PSA of this kind is therefore also particularly suitable for full-area use over an (opto)electronic structure. Full-area bonding, in the case of an approximately central disposition of the electronic structure, offers the advantage over edge sealing that the permeant would have to diffuse through the entire area before reaching the structure. The permeation pathway is therefore significantly increased. The prolonged permeation pathways in this embodiment, in comparison to edge sealing by means of liquid adhesives, for instance, have positive consequences for the overall barrier, since the permeation pathway is in inverse proportion to the permeability.

"Transparency" here denotes an average transmittance of the adhesive in the visible range of light of at least 75%, preferably higher than 90%, this consideration being based on uncorrected transmission, in other words without subtracting losses through interfacial reflection.

The adhesive preferably exhibits a haze of less than 5.0%, more preferably less than 2.5%.

The fluorine-containing thermoplastic elastomers of the invention and the fluorine-containing liquid elastomers of the invention are available commercially, for example, under the name Dai-El from Daikin (for example, G series or T500 series and G-101), Viton from Dupont (for example, Viton A-100 and A-200), Dyneon from 3M (for example, FC 2211, FC2230 or FE5832X) or Tecnoflon from Solvay Plastics (for example N215 or N535).

In preferred embodiments, the fluorine content in the fluorine-containing elastomers (thermoplastic and/or liquid) is at least 55 wt %, preferably at least 60 wt % and more preferably at least 65 wt %.

Preference is given to using thermoplastic grades, since they are completely transparent.

The adhesive of the invention can be used with particular advantage in a single-sided or double-sided adhesive tape. This mode of presentation permits particularly simple and uniform application of the adhesive.

The general expression "adhesive tape" encompasses a carrier material which is provided on one or both sides with a (pressure-sensitive) adhesive. The carrier material encompasses all sheetlike structures, examples being two-dimensionally extended films or film sections, tapes with an extended length and limited width, tape sections, diecuts (in the form of edge surrounds or borders of an (opto)electronic arrangement, for example), multi-layer arrangements, and the like. For different applications it is possible to combine a very wide variety of different carriers, such as, for example, films, woven fabrics, nonwovens and papers, with the adhesives. Furthermore, the expression "adhesive tape" also encompasses what are called "adhesive transfer tapes", i.e. an adhesive tape without carrier. In the case of an adhesive transfer tape, the adhesive is instead applied prior to application between flexible liners which are provided with a release coat and/or have anti-adhesive properties. For application, generally, first one liner is removed, the adhesive is applied, and then the second liner is removed. The adhesive can thus be used directly to join two surfaces in (opto)electronic arrangements. Also possible, however, are adhesive tapes which operate not with two liners, but instead with a single liner with double-sided release. In that case the web of adhesive tape is lined on its top face with one side of a double-sidedly releasing liner, while its bottom face is lined with the reverse side of the double-sidedly releasing liner, more particularly of an adjacent turn in a bale or roll.

As the carrier material of an adhesive tape it is preferred in the present case to use polymer films, film composites, or films or film composites that have been provided with organic and/or inorganic layers. Such films/film composites may be composed of any common plastics used for film manufacture, examples—though without restriction—including the following:
polyethylene, polypropylene—especially the oriented polypropylene (OPP) produced by monoaxial or biaxial stretching, cyclic olefin copolymers (COC), polyvinyl chloride (PVC), polyesters—especially polyethylene terephthalate (PET) and polyethylene naphthalate (PEN), ethylene-vinyl alcohol (EVOH), polyvinylidene chloride (PVDC), polyvinylidene fluoride (PVDF), ethylene-tetrafluoroethylene (ETFE), polyacrylonitrile (PAN), polycarbonate (PC), polyamide (PA), polyethersulfone (PES) or polyimide (PI).

The carrier, moreover, may be combined with organic or inorganic coatings or layers. This can be done by customary techniques, such as surface coating, printing, vapor coating, sputtering, coextruding or laminating, for example. Examples—though without restriction—here include, for instance, oxides or nitrides of silicon and of aluminum, indium-tin oxide (ITO) or sol-gel coatings.

With particular preference, these films/film composites, especially the polymer films, are provided with a permeation barrier for oxygen and water vapor, the permeation barrier exceeding the requirements for the packaging sector (WVTR<$10^{-1}$ g/(m$^2$d); OTR<$10^{-1}$ cm$^3$/(m$^2$d bar)).

Moreover, the films/film composites, in a preferred embodiment, may be transparent, so that the total construction of an adhesive article of this kind is also transparent. Here again, "transparency" means an average transmittance in the visible region of light of at least 75%, preferably higher than 90%.

In the case of double-sidedly (self-)adhesive tapes, the adhesives used as the top and bottom layer may be identical or different adhesives of the invention, and/or the layer thicknesses thereof that are used may be the same or different. The carrier in this case may have been pretreated according to the prior art on one or both sides, with the achievement, for example, of an improvement in adhesive anchorage. It is also possible for one or both sides to have been furnished with a functional layer which is able to function, for example, as a shutout layer. The layers of PSA may optionally be lined with release papers or release films. Alternatively it is also possible for only one layer of adhesive to be lined with a double-sidedly releasing liner.

In one version, an adhesive of the invention is provided in the double-sidedly (self-)adhesive tape, and also any desired further adhesive is provided, for example one which adheres particularly well to a masking substrate or exhibits particularly good repositionability.

Furthermore, the adhesive and also any adhesive tape formed using it are outstandingly suitable for the encapsulation of an electronic arrangement with respect to permeants, with the adhesive or adhesive tape being applied on and/or around the regions of the electronic arrangement that are to be encapsulated.

The inventive concept further embraces an adhesive suitable particularly for encapsulating an electronic arrangement with respect to permeants and comprising a mixture of at least one fluorine-containing thermoplastic elastomer and at least one fluorine-containing liquid elastomer and also at least one tackifier resin, the adhesive comprising this mixture to an extent of preferably at least 70 wt %, more preferably of 90 wt % (based in each case on the overall composition of the pressure-sensitive adhesive).

According to one preferred embodiment, the mass ratio of the fluorine-containing liquid elastomer to the fluorine-containing thermoplastic elastomer is also between 5:95 to 55:45, preferably between 15:75 and 50:50, and more preferably between 25:75 and 40:60.

For this adhesive as well, advantageous embodiments are all those mentioned in relation to the first adhesive—the only difference therefrom is the mandatory presence of at least one tackifier resin in a mixture of at least one fluorine-containing thermoplastic elastomer and at least one fluorine-containing liquid elastomer.

Encapsulation in the present case refers not only to complete enclosure with the stated PSA but also even application of the PSA to some of the regions to be encapsulated in the (opto)electronic arrangement: for example, the single-sided coverage or the enframing of an electronic structure.

With adhesive tapes it is possible in principle to carry out two types of encapsulation. Either the adhesive tape is diecut beforehand and bonded only around the regions that are to be encapsulated, or it is adhered by its full area over the regions that are to be encapsulated. An advantage of the second version is the easier operation and the frequently better protection.

In the case of amorphous substances, the softening temperature here corresponds to the glass transition temperature; in the case of (semi-)crystalline substances, the softening temperature here corresponds to the melting temperature.

The PSA may be produced and processed from solution, from dispersion and from the melt. Preference is given to its production and processing from solution or from the melt. Particularly preferred is the manufacture of the adhesive from solution. In that case the constituents of the PSA are dissolved in a suitable solvent, for example butanone, and the solution is applied to the carrier using techniques that are general knowledge. In the case of processing from the melt, this may involve application techniques via a nozzle or a calender. In the case of processes from solution, coatings with doctor blades, knives, rollers or nozzles are known, to name but a few.

Via the coating temperature it is possible in solvent-free operations to influence the coating outcome. The skilled person is familiar with the operational parameters for obtaining transparent adhesive layers. In solvent coating operations, the coating outcome can be influenced via the selection of the solvent or solvent mixture. Here again, the skilled person is familiar with selection of suitable solvents. Combinations of solvents boiling below 100° C. with solvents which boil above 100° C., are very suitable.

Coating from solvents or from the melt is advantageous. For such coating, formulations according to the invention offer great advantages, as has already been stated earlier on above.

An advantage of the present invention, then, in comparison to other PSAs, is the combination of very good barrier properties with respect to water vapor and especially to oxygen, in conjunction with good interfacial adhesion to different substrates, good cohesive properties and, by comparison with liquid adhesives, very high flexibility and ease of application in the (opto)electronic arrangement and on/in the encapsulation. In certain embodiments, furthermore, there are also highly transparent adhesives that can be used particularly for deployment in (opto)electronic arrangements, since the attenuation of incident or emergent light is kept very low.

Encapsulation by lamination of at least parts of the (opto)electronic constructions with a sheetlike barrier material (e.g. glass, more particularly thin glass, metal oxide-coated films, metallic foils, multilayer substrate materials) can be achieved with a very good barrier effect in a simple roll-to-roll process. The flexibility of the overall construction is dependent not only on the flexibility of the PSA but also on further factors, such as geometry and thickness of the (opto)electronic constructions and/or of the sheetlike barrier materials. The high flexibility of the PSA, however, allows realization of very thin, pliable and flexible (opto)electronic constructions.

Of particular advantage for the encapsulation of (opto) electronic constructions is if they are heated before, during or after the application of the PSA. As a result, the PSA is able to flow on even more effectively, and hence the permeation is reduced further at the interface between the (opto)electronic arrangement and the PSA. The temperature ought preferably to be more than 30° C., more preferably more than 50° C., in order to promote flow accordingly. The temperature, however, should not be selected at too high a level, so as not to damage the (opto)electronic arrangement. The temperature ought as far as possible to be less than 100° C. As an optimum temperature range, temperatures between 50° C. and 70° C. have emerged. It is also advantageous if the PSA is heated additionally or alternatively before, during or after application.

In summary, the adhesive of the invention meets all of the requirements imposed on an adhesive used for encapsulating an (opto)electronic arrangement:
low volume permeation of water vapor and oxygen, as manifested in a WVTR (Mocon) of less than 60 g/m$^2$ d, and an OTR (Mocon) of less than 2500 cm$^3$/m$^2$*d*bar,
low interfacial permeation of water vapor and oxygen, as manifested in a WVTR (Ca test) of less than 10 g/m$^2$ d and conditional on good flow of the adhesive onto the target substrates;
optional, but preferably high transparency, with a transmittance of preferably more than 90%,
optional, but preferably a haze of less than 5.0%, preferably less than 2.5%;
outstanding lamination properties for example in a roll-to-roll process, as manifested in a bond strength for the non-crosslinked system on glass of more than 1.5 N/cm, preferably more than 2.5 N/cm, and in a dynamic shear strength for the crosslinked system on glass of more than 10 N/cm$^2$, preferably greater than 20 N/cm$^2$,
very high UV stability and weathering stability, such as are particularly advantageous for (opto)electronic applications, and especially for applications such as solar cells, for instance.

BRIEF DESCRIPTION OF THE DRAWINGS

Further details, objectives, features and advantages of the present invention are elucidated in more detail below with reference to a number of figures which show preferred exemplary embodiments:

FIG. 1 shows a first embodiment of an (opto)electronic arrangement 1. This arrangement 1 has a substrate 2 on which an electronic structure 3 is disposed. The substrate 2 itself is designed as a barrier for permeants and thus forms part of the encapsulation of the electronic structure 3. Disposed above the electronic structure 3, in the present case also at a distance from it, is a further cover 4 designed as a barrier.

Figure 1:
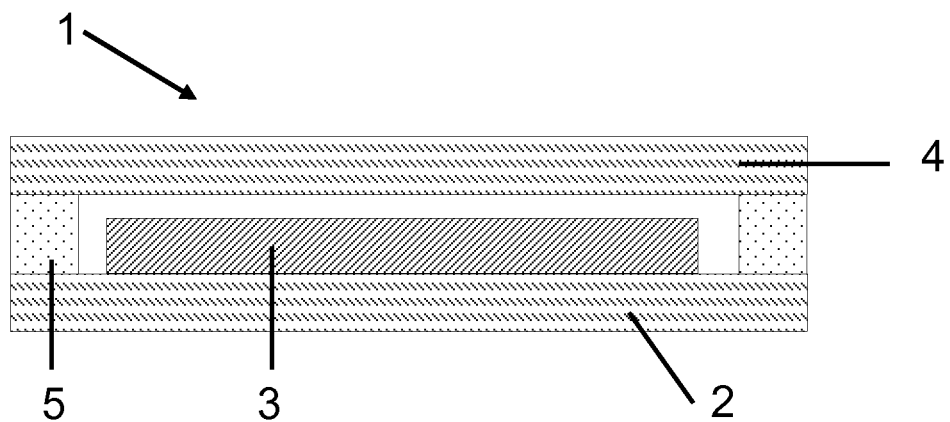
FIG. 1 shows a first (opto)electronic arrangement in a diagrammatic representation.

In order to encapsulate the electronic structure 3 to the side as well and at the same time to join the cover 4 to the electronic arrangement 1 in its remaining part, a pressure-sensitive adhesive (PSA) 5 is provided, running round adjacent to the electronic structure 3 on the substrate 2. In other embodiments the encapsulation is accomplished not with a pure PSA 5, but instead with an adhesive tape 5 which comprises at least one PSA of the invention. The PSA 5 joins the cover 4 to the substrate 2. By means of an appropriately thick embodiment, moreover, the PSA 5 allows the cover 4 to be distanced from the electronic structure 3.

The PSA 5 is of a kind based on the PSA of the invention as described above in general form and set out in more detail below in exemplary embodiments. In the present case, the PSA 5 not only takes on the function of joining the substrate 2 to the cover 4 but also, furthermore, provides a barrier layer for permeants, in order thus to encapsulate the electronic structure 3 from the side as well with respect to permeants such as water vapor and oxygen.

In the present case, furthermore, the PSA 5 is provided in the form of a diecut comprising a double-sided adhesive tape. A diecut of this kind permits particularly simple application.

Figure 2:
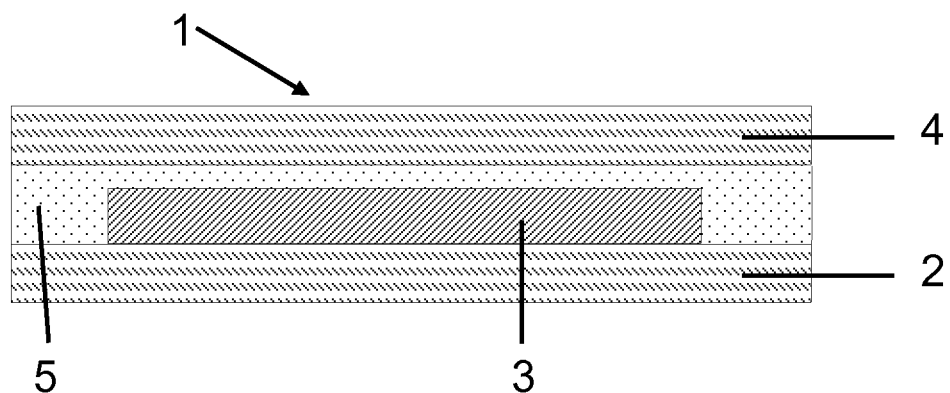
FIG. 2 shows a second (opto)electronic arrangement in a diagrammatic representation.

FIG. 2 shows an alternative embodiment of an (opto) electronic arrangement 1. Shown, again, is an electronic structure 3 which is disposed on a substrate 2 and is encapsulated by the substrate 2 from below. Above and to the side of the electronic structure, the PSA 5 is now in a full-area disposition. The electronic structure 3 is therefore encapsulated fully from above by the PSA 5. A cover 4 is then applied to the PSA 5. This cover 4, in contrast to the previous embodiment, need not necessarily fulfill the high barrier requirements, since the barrier is already provided by the PSA itself. The cover 4 may merely, for example, take on a mechanical protection function, or else may also be provided as a permeation barrier.

Figure 3:
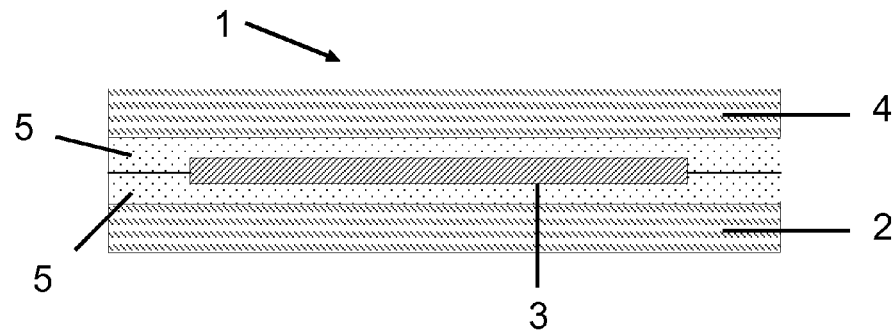
FIG. 3 shows a third (opto)electronic arrangement in a diagrammatic representation.

FIG. 3 shows a further alternative embodiment of an (opto)electronic arrangement 1. In contrast to the previous embodiments, there are now two PSAs 5a, 5b, which in the present case are identical in configuration. The first PSA 5a is disposed over the full area of the substrate 2. The electronic structure 3 is provided on the PSA 5a, and is fixed by the PSA 5a. The assembly comprising PSA 5a and electronic structure 3 is then covered over its full area with the other PSA, 5b, with the result that the electronic structure 3 is encapsulated on all sides by the PSAs 5a, b. Provided above the PSA 5b, in turn, is the cover 4.

In this embodiment, therefore, neither the substrate 2 nor the cover 4 need necessarily have barrier properties. Nevertheless, they may also be provided, in order to restrict further the permeation of permeants to the electronic structure 3.

In relation to FIG. 2, 3 in particular it is noted that in the present case these are diagrammatic representations. From the representations it is not apparent in particular that the PSA 5, here and preferably in each case, is applied with a homogeneous layer thickness. At the transition to the electronic structure, therefore, there is not a sharp edge, as it appears in the representation, but instead the transition is fluid and it is possible instead for small unfilled or gas-filled regions to remain. If desired, however, there may also be conformation to the substrate, particularly when application is carried out under vacuum or under increased pressure. Moreover, the PSA is compressed to different extents locally, and so, as a result of flow processes, there may be a certain compensation of the difference in height of the edge structures. The dimensions shown are also not to scale, but instead serve rather only for more effective representation. In particular, the electronic structure itself is usually of relatively flat design (often less than 1 µm thick).

In all of the exemplary embodiments shown, the PSA 5 is applied in the form of a pressure-sensitive adhesive tape. This may in principle be a double-sided pressure-sensitive adhesive tape with a carrier, or may be an adhesive transfer tape. In the present case, an adhesive transfer tape embodiment is selected.

The thickness of the PSA, present either as an adhesive transfer tape or as a coating on a sheetlike structure, is preferably between about 1 µm and about 150 µm, more preferably between about 5 µm and about 75 µm, and very preferably between about 12 µm and 50 µm. High layer thicknesses between 50 µm and 150 µm are employed when the aim is to achieve improved adhesion to the substrate and/or a damping effect within the (opto)electronic construction. A disadvantage here, however, is the increased permeation cross section. Low layer thicknesses between 1 µm and 12 µm reduce the permeation cross section, and hence the lateral permeation and the overall thickness of the (opto) electronic construction. However, there is a reduction in the adhesion on the substrate. In the particularly preferred thickness ranges, there is a good compromise between a low thickness of composition and the consequent low permeation cross section, which reduces the lateral permeation, and a sufficiently thick film of composition to produce a sufficiently adhering bond. The optimum thickness is dependent on the (opto)electronic construction, on the end application, on the nature of the embodiment of the PSA, and, possibly, on the sheetlike substrate.

For double-sided adhesive tapes it is likewise the case, for the barrier adhesive or adhesives, that the thickness of the individual layer or layers of PSA is preferably between about 1 µm and about 150 µm, more preferably between about 5 µm and about 75 µm, and very preferably between about 12 µm and 50 µm. If a further barrier adhesive is used in double-sided adhesive tapes as well as an inventive barrier adhesive, then it may also be advantageous for the thickness of said further barrier adhesive to be more than 150 µm.

The invention is elucidated in more detail below by means of a number of examples, without thereby wishing to restrict the invention.

TEST METHODS

Bond Strength

The bond strengths on steel were determined analogously to ISO 29863 (Method 3) at 23° C. and 50% relative humidity with a peel speed of 300 mm/min and a peel angle of 180°. An etched PET film having a thickness of 50 µm was used as reinforcing film, this film being of a kind obtainable from the company Coveme (Italy). The bonding of the measurement strip was undertaken using a roll-on machine at a temperature of 23° C. The adhesive tapes were peeled immediately following application.

Shear Adhesion Failure Temperature (SAFT)

The SAFT was determined as follows: The defined substrate used was a polished steel surface. The bondable sheetlike element under investigation was cut to a width of 10 mm and a length of about 5 cm, and immediately thereafter was pressed onto the respectively selected substrate three times, using a 2 kg steel roller with a rate of advance of 10 m/min, the substrate having an area of 10×13 mm. Immediately thereafter, the above-bonded sheetlike element was loaded with 0.5 N at an angle of 180°, and a temperature ramp of 9° C./min was run. Here, the temperature was measured at which the sample has traveled a slide distance of 1 mm. The measurement value (in ° C.) is given by the average value from two individual measurements.

Permeability for Oxygen (OTR) and Water Vapor (WVTR)

The permeability for oxygen (OTR) and water vapor (WVTR) is determined in accordance with DIN 53380 Part 3 and ASTM F-1249, respectively. For this purpose the PSA is applied with a layer thickness of 50 µm to a permeable membrane. The oxygen permeability is measured at 23° C. and a relative humidity of 50% using a Mocon OX-Tran 2/21 instrument. The water vapor permeability is determined at 37.5° C. and a relative humidity of 90%.

Transmittance

The transmittance of the adhesive was determined analogously to ASTM D1003-11 (Procedure A (Byk Hazeguard Dual hazemeter), standard illuminant D65). There is no correction for interfacial reflection losses.

HAZE Measurement

The HAZE value describes the fraction of transmitted light which is scattered forward at large angles by the irradiated sample. The HAZE value hence quantifies material defects in the surface or the structure that disrupt clear transmission.

The method for measuring the Haze value is described in the ASTM D 1003 standard. This standard requires the recording of four transmittance measurements. For each transmittance measurement, the degree of light transmittance is calculated. The four transmittances are used to calculate the percentage haze value. The HAZE value is measured using a Hazeguard Dual from Byk-Gardner GmbH.

Permeation

The permeability for oxygen (OTR) and water vapor (WVTR) was determined in accordance with DIN 53380 Part 3 and ASTM F-1249, respectively. For this purpose, the hotmelt adhesive was measured with a layer thickness of 50 µm without carrier material. The oxygen permeability was measured at 23° C. and a relative humidity of 50%. The water vapor permeability was determined at 37.5° C. and a relative humidity of 90%.

Lifetime Test

Figure 4:
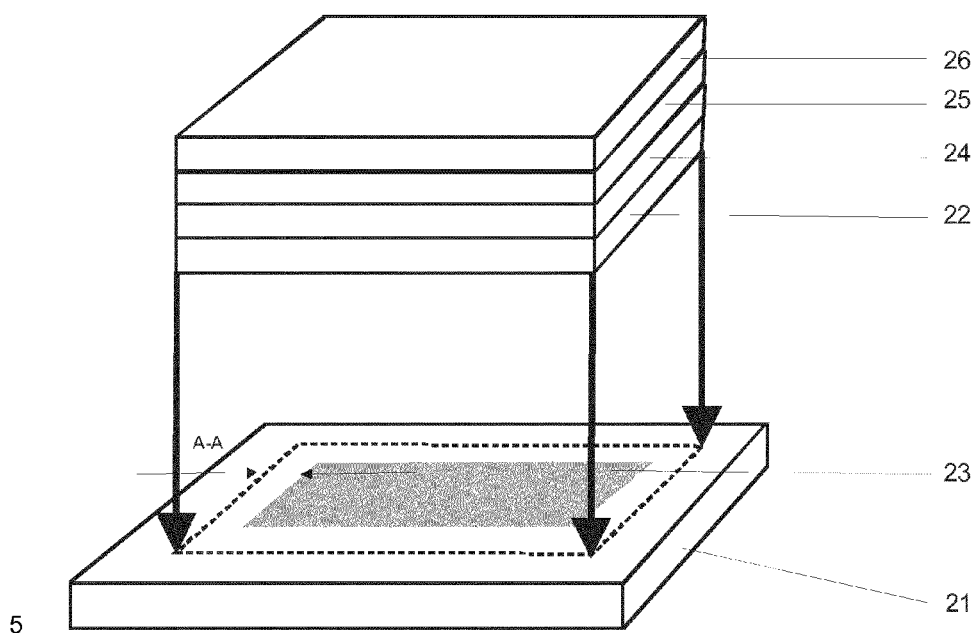
FIG. 4 illustrates a calcium test for determining the lifetime of an electronic construction.

As a measure for determining the lifetime of an electronic construction, a calcium test was employed. This is shown in FIG. 4. For this purpose, in vacuo, a thin layer 23 of calcium, measuring 20×20 mm², was deposited onto a glass plate 21 and subsequently stored under a nitrogen atmosphere. The thickness of the calcium layer 23 is approximately 100 nm. The calcium layer 23 is encapsulated using an adhesive tape (26×26 mm²) with the adhesive 22 to be tested and a thin glass plate 24 (35 µm, Schott) as support material. For the purpose of stabilization, the thin glass sheet was laminated with a PET film 26 that had a thickness of 100 µm, using an adhesive transfer tape 25 that was 50 µm thick and comprised an acrylate PSA of high optical transparency. The adhesive 22 is applied to the glass plate 21 in such a way that the adhesive 22 covers the calcium mirror 23 with an all-round margin of 3 mm (A-A). Owing to the opaque glass carrier 24, only the permeation through the PSA is determined.

The test is based on the reaction of calcium with water vapor and oxygen, as described, for example, by A. G. Erlat et al. in "47th Annual Technical Conference Proceedings—Society of Vacuum Coaters", 2004, pages 654 to 659, and by M. E. Gross et al. in "46th Annual Technical Conference Proceedings—Society of Vacuum Coaters", 2003, pages 89 to 92. The light transmittance of the calcium layer is monitored, and increases as a result of the conversion into calcium hydroxide and calcium oxide. With the test set-up described, this takes place from the margin, and so there is a reduction in the visible area of the calcium mirror. The time taken for the light absorption of the calcium mirror to be halved is termed the lifetime. The measurement conditions selected are 60° C. and 90% relative humidity. The specimens were bonded in full-area form, without bubbles, with a PSA layer thickness of 50 µm. The measurement (in h) was obtained as the average value from three individual measurements.

Weathering Stability and Yellowness Measurement

Employed as a measure of the weathering stability is an accelerated weathering procedure using a xenon arc lamp with a spectrum and intensity of the radiation similar to those of sunlight. In addition, periodic spraying with water is performed. The procedure is in accordance with ISO 4892-2 (Method A, Cycle No. 2); the total test duration is 1000 hours. For this test, the PSA is bonded between two ETFE films (Nowoflon ET, 50 µm). As a reference sample, the film is likewise stored under the conditions given above, without PSA.

The samples are evaluated in each case after 100, 500 and 1000 hours by measurement of the yellowness b* (DIN EN ISO 11664). A pass is scored in the test if after 1000 h of weathering, $\Delta b^* < 1.0$. If this threshold value is achieved at an even earlier stage, the number of hours attained is reported as the result. The specimen is measured against a white standard background (b*<2.0). The yellowness of the ETFE film is likewise taken into account in the evaluation. Standard ground and film yellowness are subtracted from the yellowness figures reported.

MMAP and DACP

MMAP is the mixed methylcyclohexane-aniline cloud point, determined using a modified ASTM C 611 method. Methylcyclohexane is employed for the heptane used in the standard test procedure. The method uses resin/aniline/methylcyclohexane in a ratio of 1/2/1 (5 g/10 ml/5 ml), and the cloud point is determined by cooling a heated clear mixture of the three components until complete clouding just ensues.

The DACP is the diacetone cloud point, and is determined by cooling a heated solution of 5 g of resin, 5 g of xylene and 5 g of diacetone alcohol to the point at which the solution turns cloudy.

Unless otherwise indicated, all quantity figures in the examples hereinafter are weight percentages or parts by weight, relative to the overall composition.

All of the raw materials were dissolved at room temperature in butanone, with a solids fraction of 40%. A knife coating process is used to coat the formulation from solution onto a siliconized PET liner, and crosslinking and drying took place at 120° C. for 10 minutes. The coat weight was 50 g/m$^2$. The specimen was lined with a further ply of a siliconized, but more easily releasing, PET liner.

For the bond strength measurement, the adhesive film was bonded to a steel substrate.

Raw Materials:

thermoplastic fluoroelastomer Dai-EL G7400BP from Daikin Industries Ltd.

fluorine content: 66% liquid fluoroelastomer Dai-EL G-101 from Daikin Industries Ltd.

fluorine content: 66% thermoplastic fluoroelastomer Viton A-100 from DuPont fluorine content: 66%

Foral 85 from Eastman, hydrogenated rosin ester

Ring and Ball Softening Point 85° C.

MMAP 7° C.

DACP<−60° C.

Magnesium oxide, from Sigma-Aldrich (599649)

<50 nm particle size (BET)

DBU, from Sigma Aldrich (139009)

1,8-diazabicyclo[5.4.0]undec-7-ene

Epikure 925 from Momentive Specialty Chemicals triethylenetetraamine hexamethylenediamine, from Sigma-Aldrich (422002)

1,6-hexanediamine

EXAMPLE 1

| | |
|---|---|
| thermoplastic fluoroelastomer Daikin Dai-EL G7400 | 95 wt % |
| liquid fluoroelastomer Daikin Dai-EL G-101 | 5 wt % |

EXAMPLE 2

| | |
|---|---|
| thermoplastic fluoroelastomer Daikin Dai-EL G7400 | 80 wt % |
| liquid fluoroelastomer Daikin Dai-EL G-101 | 20 wt % |

EXAMPLE 3

| | |
|---|---|
| thermoplastic fluoroelastomer Daikin Dai-EL G7400 | 60 wt % |
| liquid fluoroelastomer Daikin Dai-EL G-101 | 40 wt % |

EXAMPLE 4

| | |
|---|---|
| thermoplastic fluoroelastomer Viton A-100 | 60 wt % |
| liquid fluoroelastomer Daikin Dai-EL G-101 | 40 wt % |

EXAMPLE 5

| | |
|---|---|
| thermoplastic fluoroelastomer Daikin Dai-EL G7400 | 50 wt % |
| liquid fluoroelastomer Daikin Dai-EL G-101 | 40 wt % |
| Foral 85, hydrogenated rosin ester | 10 wt % |

EXAMPLE 6

| | |
|---|---|
| thermoplastic fluoroelastomer Daikin Dai-EL G7400 | 60 wt % |
| liquid fluoroelastomer Daikin Dai-EL G-101 | 37.9 wt % |
| DBU | 0.1 wt % |
| Epikure 925 | 1.0 wt % |
| MgO (Nanopowder, 50 nm) | 1.0 wt % |

EXAMPLE 7

| | |
|---|---|
| thermoplastic fluoroelastomer Daikin Dai-EL G7400 | 60 wt % |
| liquid fluoroelastomer Daikin Dai-EL G-101 | 37.9 wt % |
| DBU | 0.1 wt % |
| hexamethylenediamine | 1.0 wt % |
| MgO (Nanopowder, 50 nm) | 1.0 wt % |

EXAMPLE 8

| | |
|---|---|
| thermoplastic fluoroelastomer Daikin Dai-EL G7400 | 50 wt % |
| liquid fluoroelastomer Daikin Dai-EL G-101 | 37.5 wt % |
| Foral 85, hydrogenated rosin ester | 10 wt % |
| DBU | 0.1 wt % |
| Epikure 925 | 1.0 wt % |
| MgO (Nanopowder, 50 nm) | 1.0 wt % |

EXAMPLE 9

| | |
|---|---|
| thermoplastic fluoroelastomer Daikin Dai-EL G7400 | 40 wt % |
| liquid fluoroelastomer Daikin Dai-EL G-101 | 60 wt % |

EXAMPLE 10

| | |
|---|---|
| thermoplastic fluoroelastomer Daikin Dai-EL G7400 | 20 wt % |
| liquid fluoroelastomer Daikin Dai-EL G-101 | 80 wt % |

EXAMPLE 11

| | |
|---|---|
| thermoplastic fluoroelastomer Daikin Dai-EL G7400 | 36 wt % |
| liquid fluoroelastomer Daikin Dai-EL G-101 | 54 wt % |
| Foral 85, hydrogenated rosin ester | 10 wt % |

COMPARATIVE EXAMPLE V1

| | |
|---|---|
| SIS Vector 4113 from Dexco | 45 wt % |
| hydrogenated HC resin Escorez 5600 from Exxon | 45 wt % |
| white oil Ondina G17 from Shell | 10 wt % |

| Example | Bond strength steel [N/cm] | SAFT [° C.] | WVTR [g/m²d] | OTR [g/m²d bar] | Lifetime [h] | Weathering stability h] |
|---|---|---|---|---|---|---|
| 1 | 1.1 | 172 | 39 | 1400 | 270 | pass |
| 2 | 1.4 | 160 | 45 | 1800 | 220 | pass |
| 3 | 3.5 | 130 | 56 | 2200 | 200 | pass |
| 4 | 3.7 | 120 | 52 | 2300 | 210 | pass |
| 5 | 3.2 | 120 | 28 | 800 | 390 | pass |
| 6 | 3.1 | >200 | 52 | 1800 | 230 | pass |
| 7 | 3.5 | >200 | 53 | 1750 | 220 | pass |
| 8 | 3.2 | >200 | 25 | 680 | 420 | pass |
| 9 | 5.2 | 80 | 75 | 3500 | 170 | pass |
| 10 | 6.1 | 60 | 87 | 6800 | 150 | pass |
| 11 | 6.2 | 87 | 41 | 950 | 370 | pass |
| V1 | 9.5 | 110 | 42 | 4300 | 220 | <100 h |

The adhesives therefore exhibit outstanding suitability for the encapsulation of organic electronic constructions.

In the case of examples 1 to 8, an increased shear strength (see results of the SAFT test) is apparent. These adhesives are therefore especially suitable for the encapsulation even of sensitive electronic arrangements, particularly if a high long-term stability is required. A shear strength is advantageous, meaning that no blisters are formed in the electronic construction on storage at high temperatures and humidities, as for example 85° C. and 85% relative humidity, or in the lifetime test.

Also suitable in accordance with the invention are examples 9 to 11, particularly for solar cells which are not very sensitive to water vapor or oxygen, such as inorganic thin-film solar cells or dye solar cells, for example.

Examples 6 to 8 are crosslinked, and this leads to a significant increase in the shear strength and in the barrier effect with respect to water vapor and especially to oxygen, so making them particularly suitable for very sensitive (opto)electronic constructions with high long-term stability.

In examples 5, 8 and 11 it can be inferred that the addition of tackifier resins raises the values for WVTR and OTR, in other words further improving the barrier properties.

The invention claimed is:

1. A pressure-sensitive adhesive for encapsulating an electronic arrangement with respect to permeants, comprising to an extent of at least 70 wt. % based on the overall composition of the pressure-sensitive adhesive, a mixture of at least one fluorine-containing thermoplastic elastomer and at least one fluorine-containing liquid elastomer, the mass ratio of the fluorine-containing liquid elastomer to the fluorine-containing thermoplastic elastomer being between 5:95 to 55:45.

2. The pressure-sensitive adhesive (PSA) of claim 1, wherein the mass ratio of the fluorine-containing liquid elastomer to the fluorine-containing thermoplastic elastomer is between 15:75 and 50:50.

3. The pressure-sensitive adhesive of claim 1, wherein the fluorine-containing thermoplastic elastomer or elastomers are selected, individually or in any combination, from the group consisting of a fluorine-containing elastomer having at least one soft segment, consisting of a terpolymer of vinylidene fluoride/hexafluoropropylene/tetrafluoroethylene or vinylidene fluoride/chlorotrifluoroethylene/tetrafluoroethylene, and at least one hard segment, consisting of a copolymer of tetrafluoroethylene/ethylene or chlorotrifluoroethylene/ethylene or polyvinylidene fluoride, a fluorine-containing elastomer having at least one soft segment composed of a copolymer of tetrafluoroethylene/propylene and at least one hard segment composed of a copolymer of tetrafluoroethylene/ethylene, and a fluorine-containing elastomer having at least one soft segment composed of an amorphous rubberlike copolymer of tetrafluoroethylene/perfluoroalkyl vinyl ether and at least one hard segment composed of a copolymer of tetrafluoroethylene/perfluoroalkyl vinyl ether in which the amount of perfluoroalkyl vinyl ether is less than in the soft segment.

4. The pressure-sensitive adhesive of claim 1, wherein the thermoplastic fluorine-containing elastomer is compatible with the fluorine-containing liquid elastomer.

5. The pressure-sensitive adhesive of claim 3, wherein the monomer composition of the soft segment of the thermoplastic elastomer or the monomer composition of the fluorine-containing copolymer or terpolymer is selected to be similar to the monomer composition of the liquid elastomer.

6. The pressure-sensitive adhesive of claim 3, wherein the PSA comprises the combination of a fluorine-containing liquid elastomer composed of vinylidene fluoride, hexafluoropropylene, and tetrafluoroethylene and of a fluorine-containing thermoplastic elastomer which comprises a soft segment composed of the same terpolymer as the liquid elastomer, or the combination of a fluorine-containing liquid elastomer which is a tetrafluoroethylene/propylene copolymer or a tetrafluoroethylene/perfluoropropyl vinyl ether copolymer, and of a fluorine-containing thermoplastic elastomer having a soft segment composed of the same copolymer as the liquid elastomer.

7. The pressure-sensitive adhesive of claim 3, wherein fluorine-containing liquid elastomers used are elastomers based on vinylidene fluoride/hexafluoropropylene, on vinylidene fluoride/hexafluoropropylene/tetrafluoroethylene, on tetrafluoroethylene/propylene, on hexafluoropropylene/ethylene, fluorosilicone elastomers and/or fluorine-substituted phosphazene elastomers.

8. The pressure-sensitive adhesive of claim 1, wherein the liquid elastomer has a number-average molecular weight $M_n$ of 500 to 20 000.

9. The pressure-sensitive adhesive of claim 1, wherein the pressure-sensitive adhesive is crosslinked.

10. The pressure-sensitive adhesive of claim 1, wherein the pressure-sensitive adhesive comprises one or more additives selected from the group consisting of plasticizers, primary antioxidants, secondary antioxidants, process stabilizers, light stabilizers, processing assistants, endblock reinforcer resins and elastomeric polymers.

11. The pressure-sensitive adhesive of claim 1, wherein the pressure-sensitive adhesive comprises one or more fillers.

12. The pressure-sensitive adhesive of claim 1, wherein the pressure-sensitive adhesive is transparent in the visible light of the spectrum.

13. The pressure-sensitive adhesive of claim 1, wherein the pressure-sensitive adhesive exhibits a haze of less than 5.0%.

14. An adhesive for encapsulating an electronic arrangement with respect to permeants, which comprises a mixture of at least one fluorine-containing thermoplastic elastomer and at least one fluorine-containing liquid elastomer and also at least one tackifier resin, the adhesive comprising this mixture to an extent of at least 70 wt. %, based on the overall composition of the adhesive.

15. The adhesive of claim 14, wherein the mass ratio of the fluorine-containing liquid elastomer to the fluorine-containing thermoplastic elastomer is between 5:95 to 55:45.

16. The adhesive of claim 1, wherein the adhesive comprises at least one resin which has a DACP of more than 30° C. and an MMAP of more than 50° C.

17. The pressure-sensitive adhesive of claim 1, wherein the pressure-sensitive adhesive comprises at least one resin which has a DACP of less than 20° C. and an MMAP of less than 0° C.

* * * * *